US007126498B2

(12) United States Patent
Levy

(10) Patent No.: US 7,126,498 B2
(45) Date of Patent: Oct. 24, 2006

(54) KEYPAD CONSTRUCTION

(75) Inventor: David H. Levy, Cambridge, MA (US)

(73) Assignee: Digit Wireless, LLC, Cambridge, MA (US)

( * ) Notice: Subject to any disclaimer, the term of this patent is extended or adjusted under 35 U.S.C. 154(b) by 561 days.

(21) Appl. No.: 10/374,412

(22) Filed: Feb. 26, 2003

(65) Prior Publication Data

US 2003/0160712 A1 Aug. 28, 2003

Related U.S. Application Data

(60) Provisional application No. 60/382,906, filed on May 23, 2002, provisional application No. 60/360,052, filed on Feb. 27, 2002.

(51) Int. Cl.
*H03K 17/94* (2006.01)

(52) U.S. Cl. ...................... 341/22; 400/491.3; 200/520

(58) Field of Classification Search .................. 341/22; 400/491.3; 200/310, 313, 520, 521
See application file for complete search history.

(56) References Cited

U.S. PATENT DOCUMENTS 3,668,337 A 6/1972 Sinclair
3,870,840 A 3/1975 Rivetta et al.
3,909,564 A 9/1975 Scheingold et al.
3,999,025 A 12/1976 Sims, Jr.
4,357,646 A 11/1982 McVey et al.
4,376,238 A 3/1983 Martin
4,400,593 A 8/1983 Kunz
4,490,587 A 12/1984 Miller et al.
4,549,279 A 10/1985 Lapeyre
4,604,509 A 8/1986 Clancy et al.
4,634,818 A 1/1987 Hayes-Pankhurst et al.
RE32,419 E 5/1987 Rooney
4,680,577 A 7/1987 Straayer et al.
4,839,474 A 6/1989 Hayes-Pankhurst et al.
4,891,777 A 1/1990 Lapeyre
4,899,137 A 2/1990 Behrens et al.
4,912,462 A 3/1990 Washizuka et al.
4,994,992 A 2/1991 Lapeyre
5,124,689 A 6/1992 Franz et al.
5,269,004 A 12/1993 Comerford et al.
5,278,557 A 1/1994 Stokes et al.
5,311,175 A 5/1994 Waldman
5,329,079 A 7/1994 English et al.
5,358,344 A 10/1994 Spence
5,457,454 A 10/1995 Sugano (Continued)

FOREIGN PATENT DOCUMENTS

EP 0367204 A2 5/1990

(Continued)

*Primary Examiner*—Timothy Edwards, Jr.
(74) *Attorney, Agent, or Firm*—Fish & Richardson P.C.

(57) ABSTRACT

An IACK keypad with independent key regions arranged in an array of multiple rows and columns, and combination key regions defined between rows and columns of the array of independent key regions. A trace matrix underlying the keymat either includes, in addition to normally isolated column traces and row traces underlying the independent key regions, trace extensions extending from the row and column traces to underlie the combination key regions, or additional row and column traces underlying the combination key regions and tied to other row and column traces. The trace extensions extend to within a contact region of an opposed electrical contact, such as on a snap dome, beneath the combination key region. Independent and combination key snap domes are constructed to insure singular tactile feedback during combination key operation.

62 Claims, 8 Drawing Sheets

U.S. PATENT DOCUMENTS

| | | | | |
|---|---|---|---|---|
| 5,459,461 | A | 10/1995 | Crowley et al. | |
| 5,465,290 | A | 11/1995 | Hampton et al. | |
| 5,486,823 | A | 1/1996 | Tsai | |
| 5,491,745 | A | 2/1996 | Roeder | |
| 5,528,235 | A | 6/1996 | Lin et al. | |
| 5,535,421 | A | 7/1996 | Weinreich | |
| 5,612,690 | A | 3/1997 | Levy | |
| 5,635,958 | A | 6/1997 | Murai et al. | |
| 5,638,092 | A | 6/1997 | Eng et al. | |
| 5,691,716 | A | 11/1997 | Crowley et al. | |
| 5,793,312 | A | 8/1998 | Tsubai | |
| 5,852,414 | A | 12/1998 | Yu et al. | |
| 5,861,588 | A | 1/1999 | Gillot | |
| 5,861,823 | A | 1/1999 | Strauch et al. | |
| 5,973,621 | A | 10/1999 | Levy | |
| 6,037,882 | A | 3/2000 | Levy | |
| 6,107,997 | A | 8/2000 | Ure | |
| 6,204,839 | B1 | 3/2001 | Mato, Jr. | |
| 6,259,044 | B1 | 7/2001 | Paratore et al. | |
| 6,377,685 | B1 | 4/2002 | Krishnan | |
| 6,535,200 | B1 | 3/2003 | Philipp | |
| 6,639,162 | B1 * | 10/2003 | Sandbach et al. | 200/512 |
| 6,891,529 | B1 * | 5/2005 | Ladouceur et al. | 345/169 |
| 2002/0025837 | A1 * | 2/2002 | Levy | 455/566 |
| 2003/0107554 | A1 * | 6/2003 | Motegi | 345/168 |

FOREIGN PATENT DOCUMENTS

| | | |
|---|---|---|
| EP | 0508563 | 10/1992 |
| GB | 2054268 | 2/1981 |
| JP | 01006337 | 1/1989 |
| WO | WO 00/44014 | 7/2000 |
| WO | WO 01/95358 | 12/2001 |

* cited by examiner

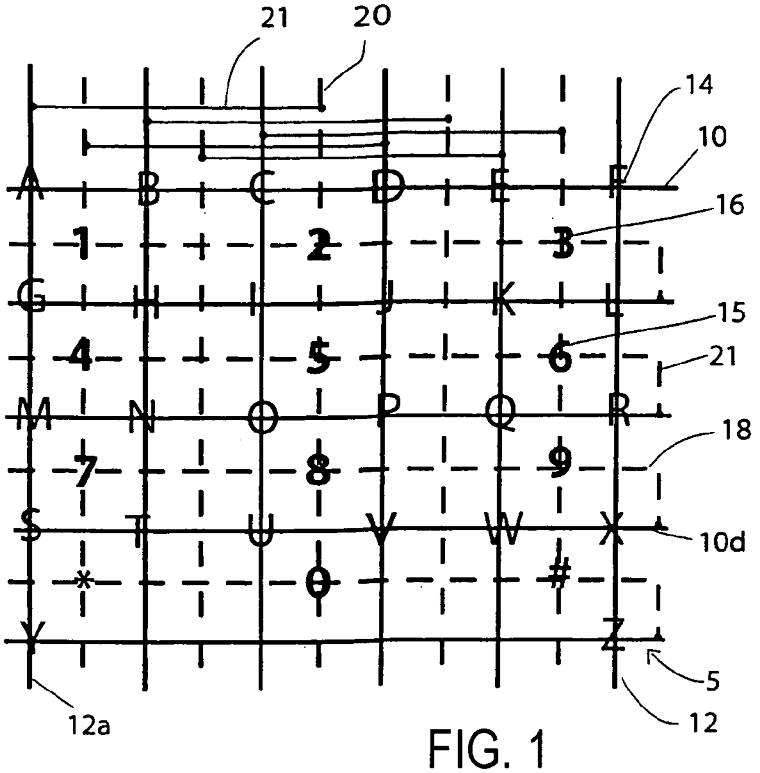
FIG. 1
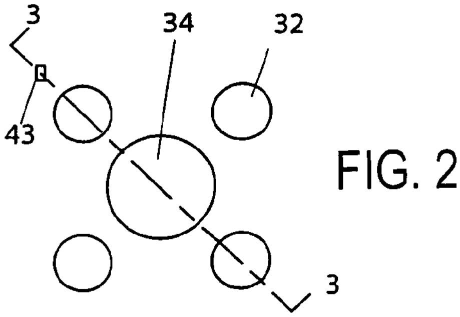
FIG. 2
FIG. 3
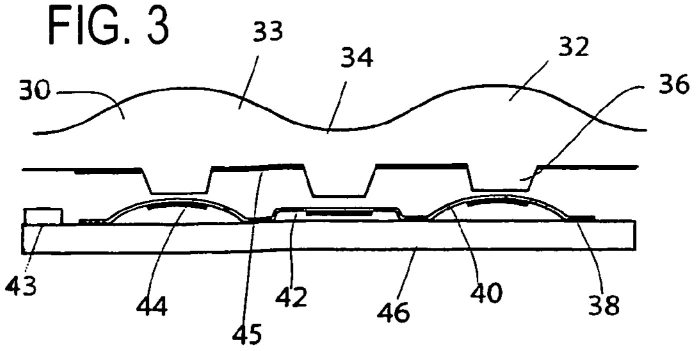

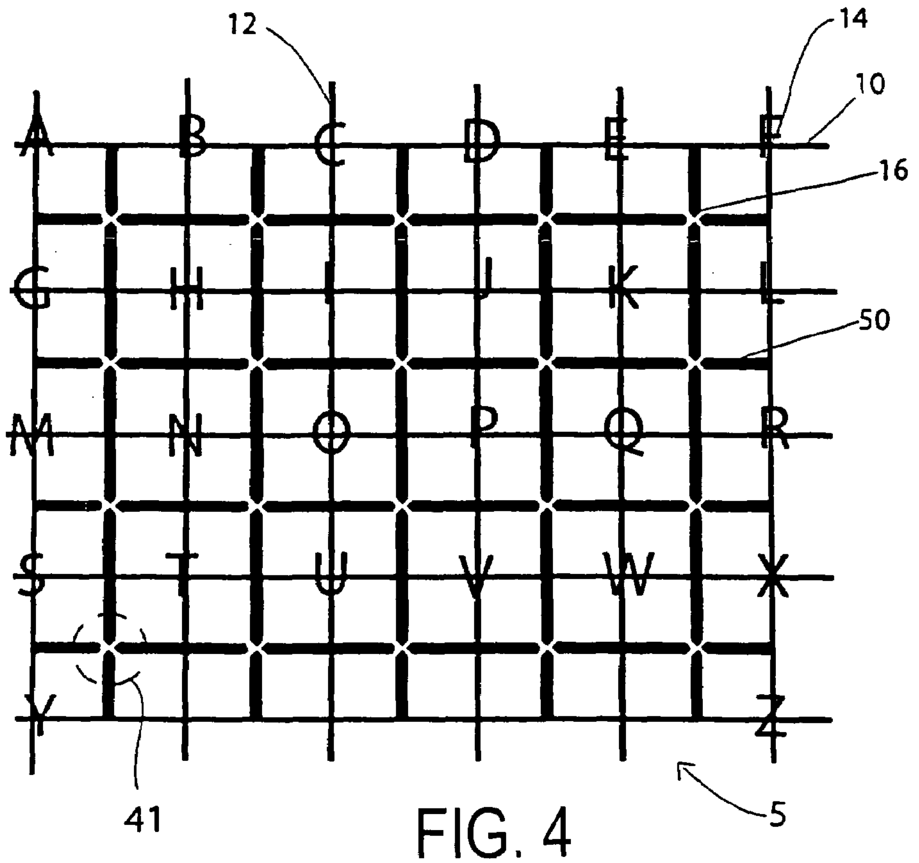
FIG. 4
FIG. 5
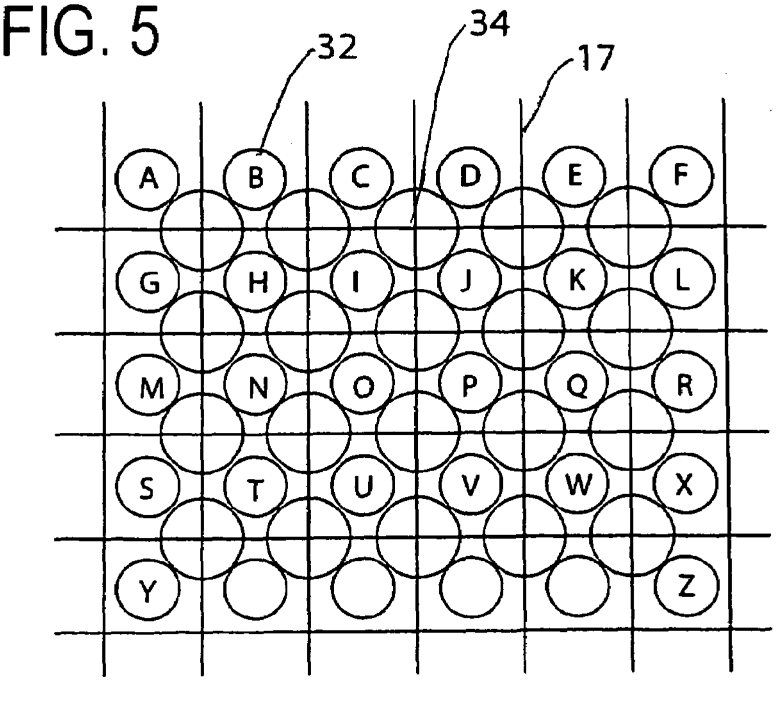

KEYPAD CONSTRUCTION

CROSS-REFERENCE TO RELATED APPLICATIONS

This application claims priority from U.S. Provisional Application Ser. No. 60/382,906, filed on May 23, 2002, and U.S. Provisional Application Ser. No. 60/360,052, filed on Feb. 27, 2002. The entire contents of these two provisional applications are hereby incorporated by reference.

TECHNICAL FIELD

This invention relates to keypads, and particularly to keypads with adjacent keys that provide respective desired outputs when pressed individually, and another desired output when pressed in combination.

BACKGROUND

The miniaturization of electronic products is one of the primary tenets of technologic advance. Competitive advantage and the success of a product line largely hinges on the ability of a company to successfully provide products that are both increasingly functional and increasingly portable. As technology advances, it becomes increasingly possible to miniaturize electronic circuitry below human scale, with the result being that the interface alone (e.g., screens, keypads, cursor control devices) come to define the size of portable products. Therefore, the ergonomic quality and size of input devices (such as keypads) continue to have a growing significance to product acceptance and success.

One type of keypad or keyboard that provides a particularly space-efficient input means are Independent And Combination Key (IACK) keypads. IACK keypads have both independent and combination key regions, typically arranged in alternating rows and columns. An independent key, or independent key region, is an element of a keypad that, when pressed independent of adjacent keys, produces an associated output. By contrast, a combination key, or combination key region, is a keypad element with adjacent independent keys (such as at diagonally-oriented corners of the combination key region) that, when pressed in combination, produce an output associated with the combination key region. Typically, both independent and combination key regions will display graphics associated with their outputs.

IACK keypads represent an advance in keypad miniaturization, as they are readily configured to have an on-center distance between adjacent independent key regions about equal to one half the width of a typical adult human finger, or only about one-third of an inch.

One challenge of implementing such keypads is interpreting whether the user intends a combination or individual key output, especially in implementations with a desirably strong and definite tactile feedback, such as with polyester or metal snap dome keys. The discrete nature of such tactile feedback means may cause problems sensing combination key input when the finger is held at an angle during key actuation, as only one switch, or two adjacent and non-diagonally oriented switches, may be actuated when the underside of the keypad membrane "bottoms out" against the underlying printed circuit board (PCB), before activating a subset of independent keys necessary to identify the intended combination key. The result is that instead of registering the desired combination output, the system registers either an erroneous output of an independent key character, or nothing at all, in the case of two adjacent non-diagonally oriented keys.

Even when the finger is held correctly, some IACK keypads with strongly defined tactile feedback will, while providing an intended combination key output, produce a plurality of tactile or even audible "clicks" as the tactile elements actuate at slightly different times. Such multiple tactile or audible feedback is disconcerting, as it is inconsistent with the user's intent of indicating a single input. The result can be an unsatisfying tactile feedback experience.

Some successful IACK keypads employ rubber domes or other less defined tactile feedback means to "hide" the plurality of switch activations that occur during a combination key input. However, well-defined tactile feedback is highly desirable feature in many products, especially at the high-end of product lines. It is therefore highly desirable to provide a single, well-defined tactile feedback "click" for each IACK keypad input, whether the input is associated with a single independent key or a combination of adjacent keys.

Solutions to these and other keypad performance issues, both for IACK keypads and conventional keypads, are desired.

Some further background information regarding IACK keypad constructions can be found in my pending U.S. patent application Ser. No. 09/862,948 filed May 22, 2001, the entire contents of which are incorporated herein by reference as if fully set forth.

SUMMARY

According to one aspect of the invention, a keypad includes an exposed keymat with independent key regions arranged in an array of multiple rows and columns, and combination key regions defined between rows and columns of the array of independent key regions. The keypad also includes a trace matrix underlying the keymat, the matrix including normally isolated column traces and row traces. Each column trace underlies the independent key regions of a corresponding column, and each row trace underlies the independent key regions of a corresponding row. The row and column traces together define an array of normally open trace intersections corresponding to the array of independent key regions. The keypad also includes a processor responsive to electrical communication between row and column traces at any trace intersection closed by independent key region actuation. The trace matrix includes trace extensions extending from the row and column traces to underlie the combination key regions, with the trace extensions in each combination key region extending to within a contact region of an associated electrical contact beneath the combination key region.

In some embodiments, trace extensions extending from the row traces form a first part of an auxiliary matrix, and trace extensions extending from the column traces form a second part of the auxiliary matrix and define auxiliary intersections with the trace extensions extending from the row traces. The auxiliary intersections are in electrical communication with corresponding intersections of the trace matrix. In some cases, the processor is configured to distinguish between an auxiliary intersection and its corresponding intersection of the trace matrix by a determined order in which individual intersections are closed.

In some configurations, the opposed electrical contact is displaced into contact with the trace extensions by simultaneous actuation of independent key regions on opposite sides of the combination key region.

Preferably, the trace matrix is connected to the processor only by a number of conductors equal to the sum of the number of rows and the number of columns of the array of independent key regions.

In some embodiments, each combination key region is bounded by two column traces and two row traces. Preferably, the trace matrix includes four trace extensions underlying each combination key region.

In some cases, the trace extensions of each combination key region have distal ends extending toward a common point within the combination key region.

In some examples, the trace extensions form a spiral pattern within the combination key region.

The opposed electrical contact, in some embodiments, is part of a snap dome under the combination key region. In some constructions, the snap dome consists essentially of an electrically conductive material. The snap dome may have an edge defining openings through which the trace extensions extend without contacting the dome edge, for example. The snap dome may have dimples extending downward from an underside surface of the dome and arranged to engage the trace extensions when the dome is snapped downward. For example, one dimple may be arranged to engage one trace extension, and another dimple arranged to engage another trace extension, when the dome is snapped downward. In one illustrated embodiment, the snap dome has four dimples arranged to engage four respective trace extensions when the dome is snapped downward. Another dome (not shown) features a roughened lower surface instead of dimples. In some cases, the snap dome straddles distal ends of the trace extensions.

In some cases, one of the trace extensions of the combination key region is in permanent electrical communication with the snap dome, with other trace extensions of the combination key region extending to conductive pads under the dome.

In some arrangements, the snap dome carries a layer of electrically conductive material on an underside of the dome facing the trace extensions, in some cases covering only a central region of the snap dome. The snap dome may consist essentially of the layer of electrically conductive material and an electrically insulating material, such as a polyester resin, formed into a dome shape.

According to another aspect of the invention, a keypad has a keymat and a switch substrate underlying the keymat. The keymat includes a continuous sheet with an exposed upper surface forming separate elevated independent key regions, with the sheet defining combination key regions between the elevated independent key regions. A series of independent key force concentrators are secured to and extend from an underside of the sheet under respective independent key regions, and a series of combination key force concentrators are secured to and extend from an underside of the sheet under respective combination key regions. The substrate includes a series of independent key tactile feedback structures underlying respective independent key force concentrators of the keymat, and a series of combination key tactile feedback structures underlying respective combination key force concentrators of the keymat.

In some embodiments, the independent key force concentrators are separated from their underlying independent key tactile feedback structures by a distance greater than any separation distance between the combination key force concentrators and their underlying combination key tactile feedback structures, measured with the keypad at rest.

Preferably, the sheet is made of a plastic material with elastic modulus of at least 100,000 pounds per square inch.

In some cases, the independent and/or combination key tactile feedback structures comprise snap domes, which may be formed of metal or polyester, for example.

Preferably, the independent key regions have greater associated stroke length than the combination key regions. By "stroke length" I mean the distance the upper surface of the key region must be deflected to actuate a tactile feedback element associated with the key region and induce an output.

In some embodiments, the combination key regions have a lower associated actuation force than the independent key regions. By "actuation force" I mean the normal force applied to the upper surface of the keypad required to actuate a tactile feedback element associated with that key region.

In some cases, the force concentrators associated with the independent key regions engage the underside of the sheet only directly beneath upper plateau areas of the independent key regions.

In some configurations, the independent key force concentrators are separated from their associated tactile feedback structures by a distance greater than an effective stroke length of the tactile feedback structures, measured with the keypad at rest.

In some embodiments, the effective stroke lengths of both the independent and combination key tactile feedback structures are essentially the same. In some cases, the stroke lengths of the independent key regions is greater than that of the combination key regions.

In some examples the switch substrate has a trace matrix underlying the keymat, with the matrix including normally isolated column traces and row traces and trace extensions. Each column trace underlies independent key regions of a corresponding column of key regions, and each row trace underlies independent key regions of a corresponding row of key regions, such that the row and column traces together define an array of normally open trace intersections corresponding to the independent key regions. The trace extensions extend from the row and column traces to underlie the combination key regions. The trace extensions in each combination key region extend to within a contact region of an associated electrical contact beneath the combination key region.

In some cases, the trace extensions extend to distal ends disposed beneath the combination key region.

Some such keypads will have at least three trace extensions disposed within each combination key region, some with four.

Preferably, the keymat is structured and arranged to operate the independent key tactile feedback structures when their associated independent key regions are individually pressed, and to operate the combination key tactile feedback structures when adjacent independent key regions on opposite sides of their associated combination key regions are simultaneously pressed.

In some constructions, independently pressing an independent key region operates the independent key tactile feedback structure associated with that region before operating the combination key tactile feedback structure underlying any adjacent combination key region.

In some cases, simultaneously pressing two independent key regions adjacent a combination key region operates the combination key tactile feedback structure underlying that combination key region before operating either independent key tactile feedback structure underlying the pressed independent key regions.

In some embodiments, the keymat has ribs depending from the keymat sheet and extending between respective combination key force concentrators and independent key force concentrators. The ribs, in some examples, are tapered in depth and/or width. In some arrangements, as an independent key region is pressed, the combination key force concentrators associated with adjacent combination key regions tilt with respect to their underlying tactile feedback structures.

In some cases, the keymat sheet forms an undulating surface contour of exposed key regions.

In some configurations, the independent key regions are arranged in rows and columns.

Preferably, the keymat sheet has an exposed surface hardness of at least 1 foot-pound per inch, measured as an Izod impact strength, notched.

In some keypads, the keymat sheet consists essentially of thermoformed (or injection-molded) resin and graphics. The graphics may be pre-applied prior to thermoforming, or defined by resin of the sheet, for examples.

The keymat sheet may be of a material selected from the group consisting of polyester and polycarbonate resins, for example.

In some embodiments, the keymat sheet and force concentrators are formed of differing materials. In some cases, the independent and combination key force concentrators are molded in place on the keymat sheet.

According to another aspect of the invention, a keypad has an exposed keymat with independent key regions arranged in an array of multiple rows and columns, and combination key regions defined between rows and columns of the array of independent key regions. A trace matrix underlies the keymat. The matrix includes normally isolated independent key column traces and row traces, with each independent key column trace underlying the independent key regions of a corresponding column, and each independent key row trace underlying the independent key regions of a corresponding row. The independent key row and column traces together define an array of normally open trace intersections corresponding to the array of independent key regions. The keypad includes a processor responsive to electrical communication between independent key row and column traces at any trace intersection closed by independent key region actuation. The trace matrix also includes combination key column traces and row traces interposed between independent key column and row traces and underlying the combination key regions, with each combination key column trace electrically joined to an associated independent key column trace, and each combination key row trace electrically joined to an associated independent key row trace.

In some arrangements, each combination key column trace is electrically joined to an associated independent key column trace separated from the combination key column trace by at least one other independent key column trace (preferably, at least two independent key column traces).

In some cases, each combination key row trace is electrically joined to an associated independent key row trace separated from the combination key row trace by at least one other independent key row trace (preferably, at least two independent key row traces).

Preferably, the trace matrix is connected to the processor only by a number of conductors equal to the sum of the number of rows and the number of columns of the array of independent key regions.

Preferably, the trace matrix is connected to the processor by only (M+N) data lines and wherein the keypad defines (M×N)+(M−1)×(N−1) independently actuatable key regions, where M and N are of the group consisting of all positive integers.

According to another aspect of the invention, a keypad has an exposed keymat with independent key regions arranged in an array of multiple rows and columns, and combination key regions defined between rows and columns of the array of independent key regions. A trace matrix underlies the keymat. The matrix includes normally isolated independent key column traces and row traces, with each independent key column trace underlying the independent key regions of a corresponding column, and each independent key row trace underlying the independent key regions of a corresponding row. The independent key row and column traces together define an array of normally open trace intersections corresponding to the array of independent key regions. The keypad includes a processor responsive to electrical communication between independent key row and column traces at any trace intersection closed by independent key region actuation. The trace matrix is connected to the processor by only (M+N) data lines, whereas the keypad defines (M×N)+(M−1)×(N−1) independently actuatable key regions, where M and N are of the group consisting of all positive integers.

According to yet another aspect of the invention, a keypad includes a keymat and a switch substrate underlying the keymat. The keymat includes a continuous sheet with an exposed upper surface forming separate elevated independent key regions that, when pressed independent of adjacent keys, produces an associated output. The sheet defines combination key regions between adjacent independent key regions that, when pressed in combination, produce an output associated with the combination key region. The substrate includes discrete tactile feedback structures underlying respective independent key regions of the keymat, and other discrete tactile feedback structures underlying respective combination key regions of the keymat.

In some embodiments, both independent and combination key regions display graphics associated with their outputs.

Preferably, the keypad is constructed to actuate the tactile feedback structure underlying one of the combination key regions when pressing two diagonally-oriented, independent key regions adjacent the combination key region. More preferably, pressing two diagonally-oriented independent key regions adjacent the combination key region actuates the tactile feedback structure underlying the combination key region before actuating either of the tactile feedback structures underlying the two pressed independent key regions. In many instances, four independent key regions at four corners of a square bounding the combination key region are actuated simultaneously, with the force of such actuation transmitted to the tactile feedback structure underlying the combination key region, actuating that tactile feedback structure prior to actuating any of the tactile feedback structures underlying the independent key regions.

According to another aspect of the invention, a keypad includes a keymat and a light source. The keymat has a continuous sheet with an exposed, undulating upper surface forming separate elevated independent key regions that, when pressed independent of adjacent keys, produces an associated output. The sheet defines combination key regions between adjacent independent key regions that, when pressed in combination, produce an output associated with the combination key region. The light source introduces light into an optically transmissive layer of the keymat, thereby illuminating graphics associated with multiple key regions of the keymat with light conducted along the keymat layer from the light source. In some cases, significant portions of the light used to illuminate graphics is introduced from the side, thereby producing what could be called side-lighting, as opposed to “back” lighting.

In some embodiments, the optically transmissive layer is of an optically transmissive polymer in continuous contact with the sheet having the exposed upper surface.

In some cases, the keypad also includes a light pipe disposed between the keymat and the light source and configured to direct light from the light source toward a light inlet on the keymat. Preferably, the light pipe extends generally from a light source near an edge of the keymat, to direct light in a specific direction toward a light inlet nearer the center of the keymat than the light source.

The optically transmissive layer may be in the form of an elastomeric web containing a series of rigid inserts disposed directly above corresponding tactile feedback elements associated with independent key regions of the keymat, for example.

This aspect of the invention can provide desirable lighting effects for keymat graphics, and can be particularly useful when substrate component density is high and space for light sources is lacking directly beneath particular key regions, as is the case with many IACK keypad constructions.

According to yet another aspect of the invention, a keypad has a keymat and a switch substrate underlying the keymat. The keymat includes a continuous sheet defining both an active region and a deflection zone. In the active region an exposed upper surface of the sheet forms separate elevated independent key regions that, when pressed independent of adjacent key regions, produces an associated output. The sheet also defines combination key regions between adjacent independent key regions that, when pressed in combination, produce an output associated with the combination key region. The deflection zone extends about a perimeter of the active region. The keymat has a lower stiffness in the deflection zone than in the active region.

This aspect of the invention can enhance deflection of the active region of the keymat with respect to a housing to which the perimeter of the keymat is mounted, and reduce edge effects in key actuation stiffness and tactile response.

According to another aspect of the invention, a keypad includes a keymat defining an array of discrete key regions, an array of snap domes, each snap dome underlying a corresponding key region of the keymat, and a pattern of electrical traces underlying the snap domes. Each snap dome is arranged to electrically connect at least three electrical traces when actuated by pressing on its corresponding key region.

Examples of this aspect of the invention features various snap dome constructions, examples of which are described below.

In some embodiments, the electrical traces connected during actuation of a snap dome each extend to a distal end underlying the snap dome.

In some cases, each snap dome is arranged to electrically connect four electrical traces when actuated by pressing on its corresponding key region.

According to yet another aspect, an IACK keypad includes elastomeric tactile feedback structures under one set of key regions (e.g., under combination key regions), and snap dome tactile feedback structures under another set of key regions (e.g., under independent key regions), so as to provide different tactile feedback responses for the two sets of key regions.

In some cases, the elastomeric tactile feedback structures have a stroke length at least twice as long as that of the snap dome tactile feedback structures.

Certain aspects of the invention can enable the use of hard, durable keymat materials while providing a tactile feedback similar to that of conventional keypads, allowing for keypad graphic printing on a flat surface (e.g., by silkscreening before thermoforming the exposed keymat surface), and providing reliable IACK switch operation in a relatively dense switch array. The invention can, in some cases, provide a single, clear and distinct tactile feedback response from the actuation of each combination key of an IACK keypad while also providing a single, clear and distinct tactile feedback response from the actuation of each independent key of an IACK keypad, such as with tactile feedback elements under each of the combination and independent keys. One example of this method may include tuning the materials and geometries of the keypad and tactile feedback elements such that, when pressing the set of independent keys associated with a combination key, the compression and deflection within the keypad are sufficiently low that the force is transmitted to a single tactile feedback element located below the selected combination key, and when pressing a single independent key the compression and deflection within the keypad are sufficiently high that the force is transmitted to a single tactile feedback located below the independent key. A more detailed example includes the deflection of the independent keys required to actuate their associated tactile feedback elements being greater than the deflection of the combination keys required to actuate their associated tactile feedback elements. Another example includes using a rigid structure disposed between the underside of the independent key graphic area and its associated tactile feedback element that does not contact sloping sides of the independent key, allowing the sloping slides to deflect. A yet more detailed example includes forming the geometry such that a finger may apply force directly to central portions of the combination key regions. Another example includes using a higher force to actuate the independent keys than the combination keys. Some aspects of the invention can provide particularly advantageous levels of reliability in registering intended inputs with an IACK keypad, such as by determining intended key input as a function of the order of key region actuation, and/or by providing switches underlying combination key regions.

It is desirable in some devices to provide distinctly different feedback between the combination keys and independent keys, especially to mimic the different functions being provided. For example, combination keys related to a traditional 12-button keypad may have a shorter stroke and better-defined tactile feedback (to mimic the traditional telephone feedback) while the independent keys of the same device may have a longer stroke and less-defined tactile feedback (to mimic a desktop keyboard). It is also desirable to integrate an IACK keypad directly into the body of the device. Tactile feedback may also be provided by the contact surface itself.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1 shows a first switch matrix for an IACK keypad.

FIG. 2 is a top view of a key element of an IACK keypad.

FIG. 3 is a cross-sectional view, taken along line 3—3 in FIG. 2.

FIG. 4 shows a second switch matrix for an IACK keypad.

FIG. 5 shows an alternate embodiment of an IACK keypad.

Like reference symbols in the various drawings indicate like elements.

DETAILED DESCRIPTION

Figure 8:
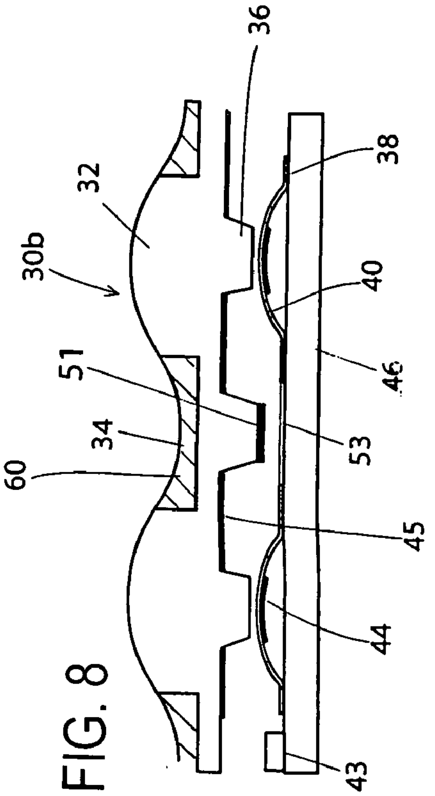
FIGS. 6–9 illustrate alternative keypad constructions, in cross-section.

FIG. 1 shows a representation of a switch matrix 5 for an IACK keypad. Although horizontal traces 10 are electrically isolated from vertical traces 12, electrical connectivity between them can be made at each independent intersection 14, which, in this embodiment, corresponds to the location of an independent key 32 (FIG. 3). This matrix also includes horizontal combination traces 18 and vertical combination traces 20, both shown in dashed lines. Combination intersection 15 between corresponding traces 18 and 20 is activated when the user presses on combination key 34 (FIG. 3). Matrix 5 is driven through vertical traces 12, and read by the processor inputs along horizontal traces 10. Each horizontal combination trace 18 is electrically connected to the horizontal trace 10 directly below it through a bridge 21. Also, each vertical combination trace 20 is electrically connected by a bridge 21 to a vertical trace 12 that is separated from the vertical combination trace by at least one other vertical trace 12. In the arrangement shown, each vertical combination trace 20 is electrically connected to a vertical trace 12 that is separated from the vertical combination trace by two other vertical traces 12. Vertical combination traces 20 are electrically isolated from horizontal combination traces 18, although electrical connectivity can be made at each combination intersection 15, which in this embodiment corresponds to a respective combination key 34 (FIG. 3).

This structure creates a redundancy between combination intersections 15 and independent intersections 14 in such a way that a single finger cannot physically strike both at once. For example, this system cannot distinguish between electrical connectivity at the independent intersection 14 under the letter "G" and electrical connectivity at the combination intersection 15 under the number "2." The two switches are, in a sense, redundant. Similarly, each independent intersection 14 has an associated combination intersection 15, which we can call a phantom switch, and the two keys corresponding to each pair of associated switches are impossible to simultaneously press with one finger. That is to say, each phantom (combination) switch has a real and measurable output, but only when measured at its associated independent intersection 14. However, without additional information it is impossible for the system to know, from sensing the matrix, which of the two associated switches is closed.

This structure allows for a new algorithm for analyzing user intent to actuate combination key regions, as described below. The new algorithm is based on the pairing of actual independent key switches 14 with distant "phantom" combination key switches 15, using known physical relationships between keys and determining the sensed sequence of contact closings to effectively create an entire additional, overlapped switch matrix, thereby providing a finer switch resolution without increasing the number of processor connections.

Still referring to FIG. 1, if the system indicates the user is simultaneously pressing the letter "S" (i.e., contact between sense lines 12*a* and 10*d* is registered) and any (or all) of the set "U", "O" and "P", they must be pressing the number "8". On the other hand, if the system senses that the user is simultaneously pressing the letters "S" and "V" (i.e., contact between lines 10*d* and both 12*a* and 12*d* is registered), the user could be pressing either the "7" or the "8", as the keys "V" and "7" are one redundant pair, and "S" and "8" are another pair. In such a case, the next level of differentiation may be determined by identifying the order of key actuation, knowing that the independent keys of the matrix are raised or are otherwise structured so as to close their underlying switches before those of adjacent combination keys. If the "V" was registered first, therefore, the intended input is "8". If the "S" was registered before the "V", the user intended a "7". In this example, the order of actuation is determined by the relative heights of the force concentrators 36 of FIG. 3. While many variations are possible, the important result is that only ONE independent key switch (and its associated phantom switch, which is registered as a second independent key) must be activated to allow the system to determine user intent to actuate a combination key 16. A significant benefit of this approach is that, although it contains a greater number of traces than a standard IACK keypad, it does not require an increased number of connections to a processor, as the combination traces 18, 20 are sensed only via the independent traces 10, 12.

The matrix arrangement in FIG. 1 enables a method for identifying user intent in an IACK keypad, in which the order of key actuation is a determining factor in identifying the desired key input. This provides an example of a keyboard switch matrix in which electrically equivalent rows of the matrix are spaced from each other by at least four rows that are electrically nonequivalent.

FIG. 2 shows a portion of an IACK keypad, with four independent keys 32 surrounding a combination key 34.

As shown in FIG. 3, keymat 30 includes an elevated independent key or key region 32 and a relatively lowered combination key or key region 34. Force concentrators 36 transmit the force from an activating finger to actuate the underlying switch elements, and the relative heights of the stress concentrators play a role in determining the order of key actuation. Polyester dome array 38 includes tactile elements 40 directly beneath independent key regions 32, and a low-force switch element 42 disposed directly beneath combination key region 34. Polyester dome array 38 also includes conductive ink 44 printed on the underside of the tactile and switch elements that closes switches printed on PCB 46 when the keys are pressed. Low-force switch elements 42 are preferred because of the low force required to displace them, increasing the reliability of combination key activation. Other switch technologies, such as metal dome arrays, may be used.

In pressing a combination key region 34, the user may activate anywhere between one and four of the tactile elements 40 associated with the surrounding independent key regions 32. The result will be one to four tactile feedback "clicks" as the selected combination key 34 is pressed FIG. 3 also shows a light-emitting diode (LED) 43 mounted to PCB 46 and arranged to inject light into keymat 30 for a backlighting effect. Selected regions of the underside of the keymat 30 are coated with reflective ink 45 to enhance the brightness of the backlighting.

FIG. 4 shows a switch matrix 5' constructed to accomplish a similar objective to that of FIG. 1. As in the matrix of FIG. 1, horizontal traces 10 are electrically isolated from vertical traces 12, although electrical connectivity between them can be made at each independent intersection 14, corresponding to the location of an independent key region. As in some earlier IACK keypads, the system registers a combination key input from the activation at least two diagonally adjacent independent key regions. For example, activating both "E" and "L", or "F" and "K", is registered by the system as an intention to enter the number "3". In this matrix, however, trace extensions 50 extend from each of the four trace segments that bound each combination key region, to almost contact each other at each combination intersection 15. Trace extensions 50 extend in each combination key region to within a contact region 41 of an opposing electrical contact, such as conductive ink 44 (FIG. 3). The conductive ink may be selectively doped or otherwise varied to provide a unique resistance at each intersection during contact, such that the identity of the intersection under contact can be verified by sensing trace resistances.

Actuation of a combination key region directly above a combination intersection 15 closes contact between the four adjacent ends of the trace extensions 50 at that intersection 15, thereby connecting the adjacent pairs of horizontal traces 10 and vertical traces 12 and creating the electrical equivalent of actuating all four surrounding independent intersections 14. Examples of switch constructions for connecting all four trace extensions 50 of a given combination intersection 15 are shown in FIGS. 18–23.

FIGS. 1 and 4 illustrate IACK keypads in which combination key output may be determined by sensing, in combination, one independent key switch and one combination key switch.

In FIG. 5 each independent key 32 is associated with four alternate intersections 17, and therefore four switch elements. As with previous IACK keypads, two adjacent diagonal switches (of the associated set of four) are required to indicate the user's intent to input each central character (i.e., a character registered by activation of more than one surrounding keys) to the system. In this embodiment, however, that central character is located on an elevation. Likewise, combination keys 34 sit over a single alternate intersection 17. As shown, this arrangement requires two additional lines to the processor, but allows combination keys 34 to be readily identified by a single switch element. Likewise, because independent keys 32 include an elevated center, the force applied by the finger is much more evenly distributed, greatly enhancing the probability of activating adjacent diagonals, thereby improving the overall performance, especially of discrete switch implementations in an IACK keypad.

Figure 6:
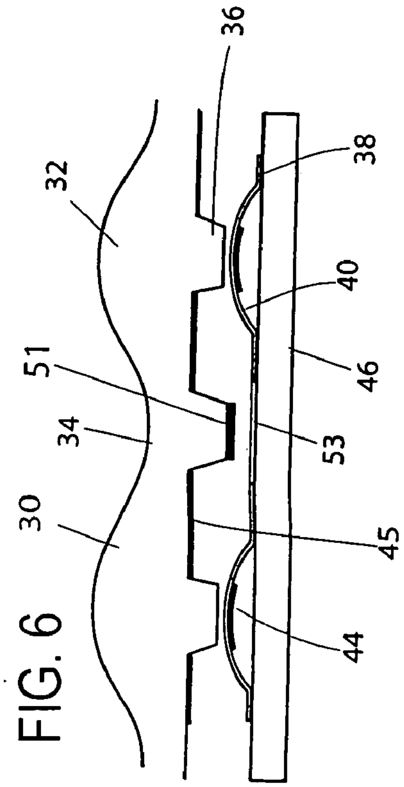

FIG. 6 shows an alternate keypad construction in which the contact element of lowered combination key region 34 is replaced by carbon pill 51. The low-force switch element of polyester dome array 38 has been replaced by a hole 53 through the dome array to expose a trace on the PCB 46. Other switch technologies, such as metal dome arrays, may be used. The user may activate one to four of the tactile elements 40 associated with each combination key region.

Figure 7:
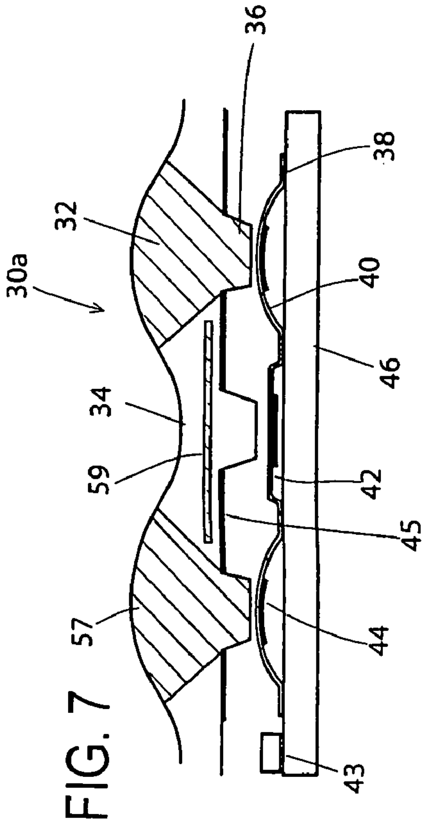

FIG. 7 shows a keymat **30*a* molded to include high durometer wedges 57 at the raised independent key regions 32, surrounded by a lower durometer material exposed at the combination key regions 34. In this embodiment, wedges 57 are cone-shaped, with outermost portions of the wedges extending above rigid plates 59 under the combination key regions. As independent keys 32 are pressed beyond a certain point, force is transmitted from independent keys 32 through plate 59 to the force concentrator 36 located under combination key 34. An array of plates 59 may be molded integrally with wedges 57** of a single high durometer elastomer or plastic, joined at the wedges at living hinges, for example, and then overmolded with the surrounding low durometer material, or configured as separate pieces as shown.

FIG. 8 shows a keymat **30*b* in which ovals 60 of a relatively high durometer material, such as a plastic, are exposed in combination key regions 34. The relatively high durometer material serves as a force bridge similar to plate 59 of the keymat of FIG. 7**.

Figure 9:
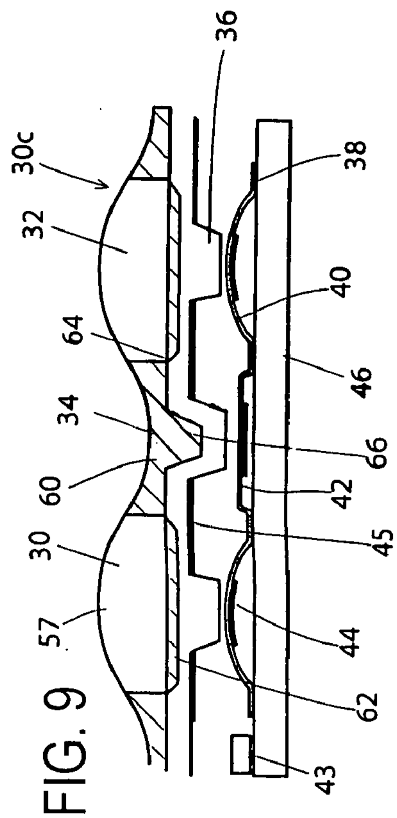

In FIG. 9 ovals **60*a* are connected to each other via links 62. While links 62 may be rigidly attached, they are illustrated here with thinned sections 64, providing a "living hinge" to enhance the motility of independent keys 32, while still providing an improved force transmission means to the switches disposed beneath combination keys 34. Ovals 60*a* have depending nubs 66. The thickness of nub 66 is selected to provide a desired amount of deformation of the elastomeric material of keymat 30*b* during actuation of a combination key 34**.

Figure 10A:
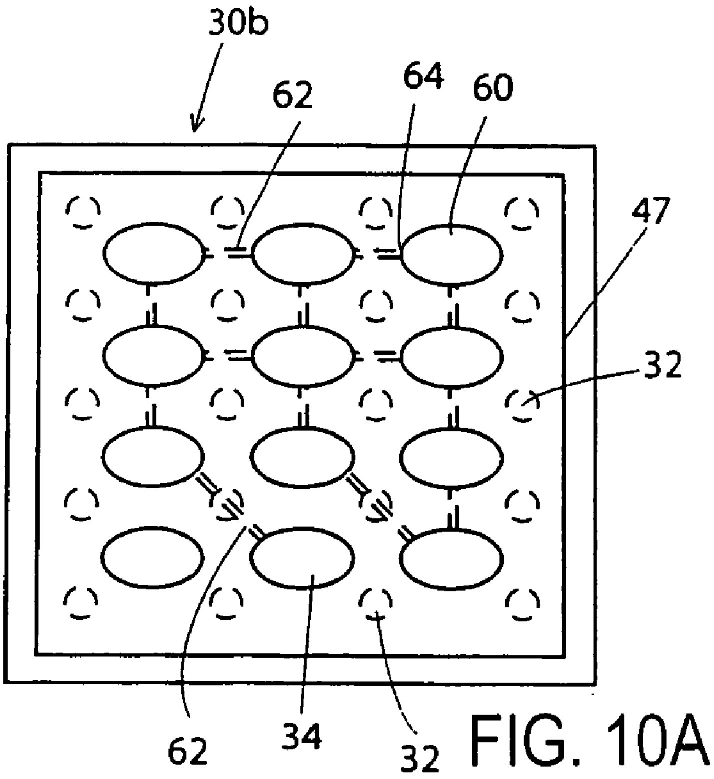
FIG. 10A is a top view of a keypad structured as shown in FIG. 9.

FIG. 10A is a top view of the keypad structure shown in FIG. 9, in which independent keys 32 are represented by dashed circles. Combination keys 34 are identified by graphic characters printed on ovals 60. While oval is a preferred shape, other shapes, such as circles, may also be employed. Links 62 may be rectilinear as shown in the top half of this illustration, or diagonally oriented as shown in the shown in the lower half. Diagonal links are considered to provide greater force transmission to the switches of combination keys 34. Links 62 and ovals 60 may float within keymat **30*b* (i.e., only contact a relatively lower durometer material as opposed to a rigid housing of the device). Such floating can increase structural integrity, avoid impeding edge effects, and increase flexibility of the manufacturing process. To further reduce edge effects, edge treatment 47 (described in FIG. 10**B) may be employed.

Figure 10B:
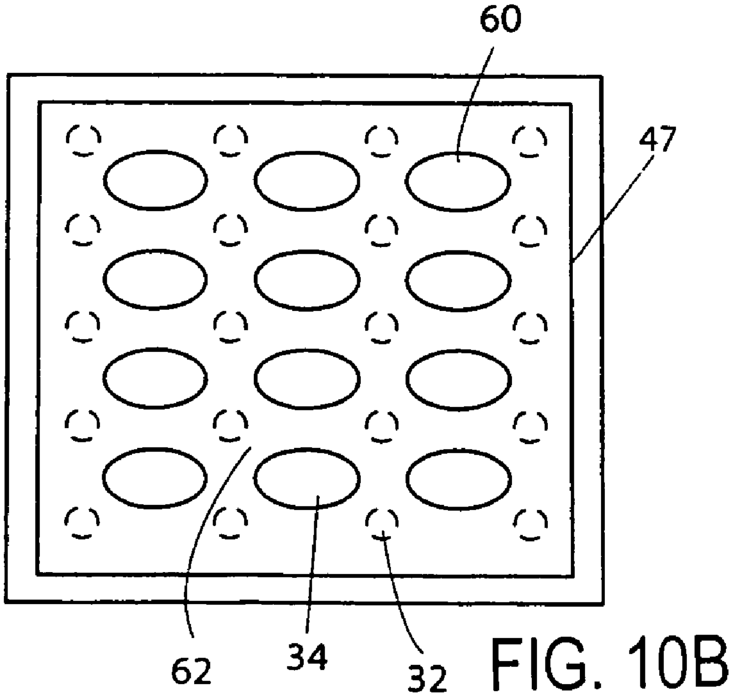
FIG. 10B shows a relatively rigid keypad with enhanced motion at the periphery.

FIG. 10B shows an IACK keypad 33 with a relatively rigid center section spanning all of the key regions, and a flexible edge region 47. Edge region may be of the same material as the center section but of lesser thickness, or may be of a material of lower durometer than the center section. The center section of keypad 33 thus deflects during operation, at least to a degree, as a single large key. In other words, low force deflection is spread over a large area of the keypad instead of being concentrated in a local area of finger contact. Thus, for any given keystroke, a portion of key deflection occurs locally and another portion is extends "globally," over the entire center region of keypad 33. This improves the reliability of the actuation of combination keys 34 by reducing the relative motion that occurs between the independent keys 32 for a given keystroke. This construction has benefit to flexible keypads as shown in FIG. 10A, but has enhanced benefit to keypads of reduced flexibility, as shown here.

Figure 11:
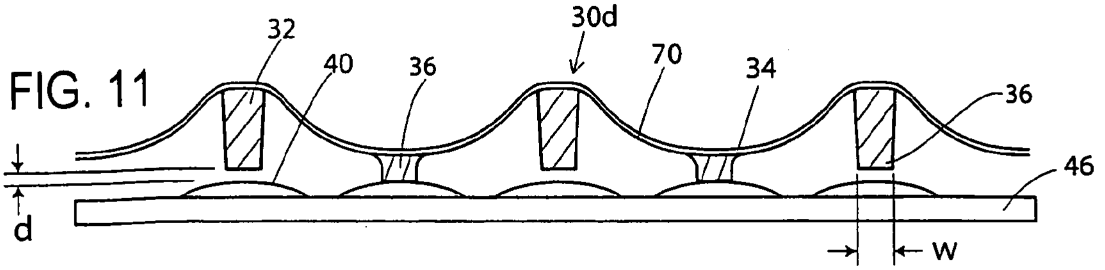
FIGS. 11–13 show various states of operation of a first keypad construction.
Figure 12:
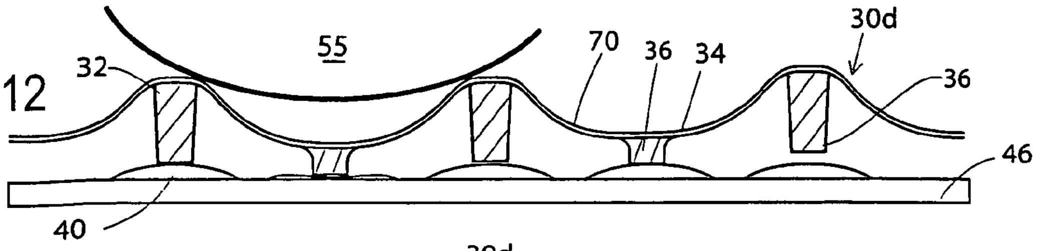
Figure 13:
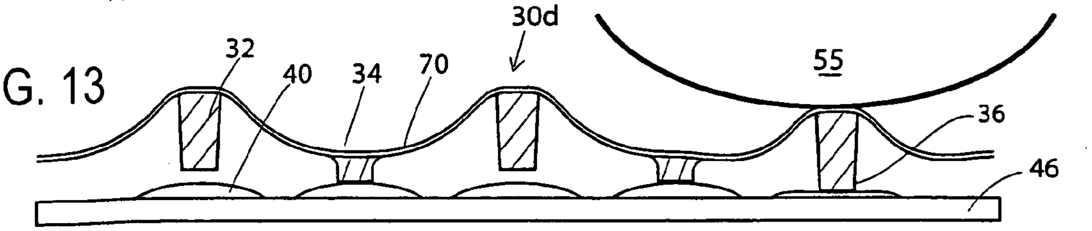

FIGS. 11–13 illustrate the operation of an IACK keymat 30*d* having a thin sheet 70 formed into the undulating surface contour of the exposed key regions, including elements for independent keys 32 and combination keys 34. The sheet 70 may be made of relatively hard and stiff material, such as polycarbonate or polyester, and formed with a process such as thermoforming. A sheet thickness of 0.002 to 0.005 inch is preferred, for example. Below each independent key region 32 is a force concentrator 36 of another material, formed in place such as by injection molding. Force concentrators 36 are disposed directly above respective, high-feedback tactile elements 40, such as metal or polyester domes. Likewise, there is a force concentrator 36 and high-feedback tactile element 40 below each combination key region 34.

The width "w" of the distal ends of force concentrators 36 may be selected to provide a desired "trip force" of each tactile element 40. As shown, there is a difference in the spacing between the lower surfaces of force concentrators 36 and their associated contact elements 40. The area of contact between sheet 70 and the force concentrators 36 of the independent keys 32 is limited to the portion of the independent key 32 that will not deform during use, predominantly the flat area at the top that is contacted by a finger 55 during activation of the independent key (FIG. 13). The object is to transmit force to the tactile feedback element 40 while minimizing the rigidity of the sloped sides of the independent keys 32. The structure or structures that transmit force between sheet 70 and tactile feedback elements 40 need not be attached to sheet 70. At rest (FIG. 11), the force concentrators 36 located below independent key regions 32 are separated from their associated tactile elements by a distance "d" at least slightly greater than the stroke length of the tactile elements. In this illustrated embodiment, the heights and stroke lengths of all tactile elements 40 are the same. Combined with trace matrix arrangements as shown in FIGS. 1 and 4, this structure advantageously provides a single, well-defined tactile feedback when either a combination key 34 or an independent key 32 is actuated.

As shown, independent key force concentrators 32 underlie only the uppermost plateau regions of the independent key regions, across which the majority of finger actuation force is applied. This leaves the slanted sides of the raised independent key regions free to bend during key actuation, as not constrained by the force concentrators. This can be contrasted with the force concentrator structure shown in FIGS. 14–16, for example.

As a user's finger 55 presses to input the character printed on combination key 34 (FIG. 12), some deformation occurs within sheet 70, but the primarily result is downward deflection of the adjacent independent key regions 32 as the intended combination key region 34 deflects downward. Notably, however, the tactile element 40 directly below the combination key region 34 is tripped at a lower deflection distance than those of the adjacent independent key regions 32, as shown in FIG. 12. This provides a single and highly-defined tactile feedback (such as from a metal or poly dome) in response to actuating a combination key 34.

Conversely, as a user's finger 55 presses to actuate an independent key region 32 (FIG. 13), the tactile element 40 directly below that independent key is tripped before any of the surrounding tactile elements is tripped. As long as the force required to deflect sheet 70 about the actuated independent key region is less than the combined trip force of the tactile elements 40 located below the adjacent combination key regions 34, the selected independent key 32 will continue to advance to trip only its associated tactile element 40.

Figure 14:
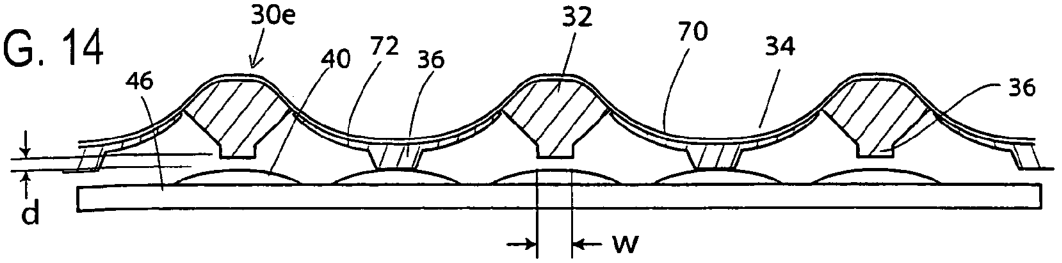
FIGS. 14–16 show various states of operation of a second keypad construction.
Figure 15:
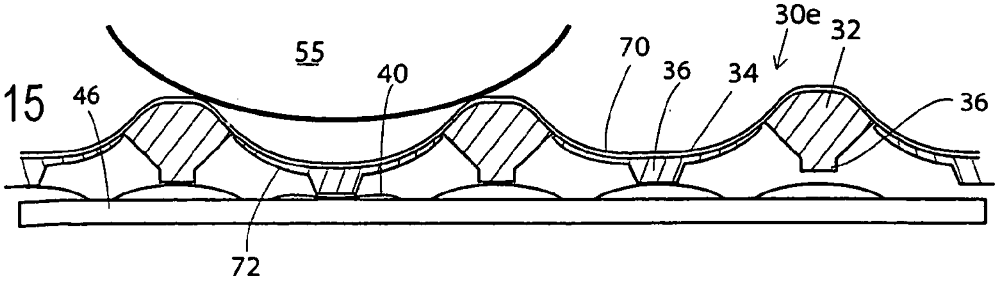
Figure 16:
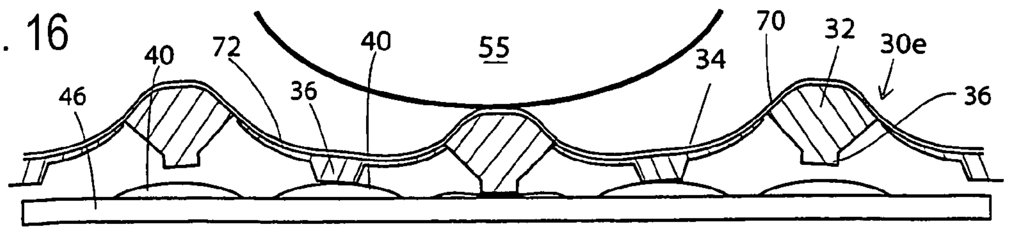

FIGS. 14–16 illustrate the same operational states as FIGS. 11–13, respectively, but with a keymat 30*e* having tapered, rigidity-enhancing ribs 72 extending radially from the base of each combination key force concentrator 36 to each of the surrounding independent key force concentrators 36. As shown, ribs 72 are thicker, to have greater cross-sectional moments of inertia to resist bending out of the plane of the sheet, nearest the combination key force concentrators 36, and taper in thickness for progressively reduced bending resistance toward the independent key regions.

During combination key actuation (FIG. 15), ribs 72 act as force conduits, transmitting actuation force along sheet 70 to the appropriate combination key force concentrator 36. Ribs 72 also provide greater control over the rigidity of sheet 70, for transmitting torque from a single actuated independent key region 32 to tilt the force concentrators of the adjacent combination key regions 34, as shown in FIG. 16. The corresponding rotation of the combination key region causes some upward motion of the adjacent independent keys 32, as shown, with the snap domes 40 of the combination key regions acting as fulcrums but not tripping. In another embodiment, not shown, the distal ends of the combination key force concentrators are very narrow, to allow relatively easy tilting of the combination key fore concentrators with respect to their snap domes during independent key actuation. Coating the underside of the combination key force concentrators with a low friction material such as polyethylene, or forming the force concentrators from such a material, can also help to avoid unintentional tripping. Thus, ribs 72 enable a selective increase in the rigidity of sheet 70, for tuning deflection regions somewhat independent from the geometry of exposed keypad sheet 70.

Additionally, for some applications the tactile elements 40 below the combination key regions 34 are physically different from those of the independent key regions 32, to help assure only one snap dome actuation for each intended keystroke. For example, snap domes of different stroke lengths, trip forces, or shapes may be configured to advantage in combination with selected geometries, durometers and other physical properties of sheet 70 and force concentrators 36. One such example is the trip force of the tactile elements 40 located below the independent keys 32 (e.g., about 250–300 grams) being higher than the trip force of the tactile elements 40 located below the combination keys 34 (e.g., about 100–200 grams).

Figure 17:
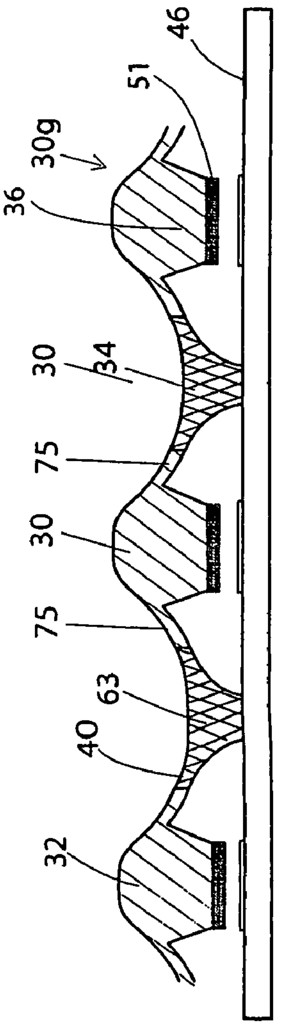
FIG. 17 is a cross-sectional view of an IACK in which only the independent keys move and which further includes a rigid plastic matrix.

Referring now to FIG. 17, IACK keymat 30*f* is integrally molded in a "two-shot" process, with independent keys 32 molded in corresponding holes of a relatively rigid plastic matrix 63 that forms combination key regions 34. The switch function in this embodiment is provided by a carbon pill 51 disposed below each independent key 32, which is molded from a relatively low durometer elastomer, preferably of a durometer of about 45–55 shore A. As shown here, tactile feedback is provided by integrally molded, circular flanges 75 connecting the independent keys 32 to plastic matrix 63. Flanges 75, and even the extent of independent key regions 32, may be reinforced with narrow ribs of plastic of matrix 63, for enhanced snap force. As drawn here the independent keys 32 are approximately round in top view, with matrix 63 forming the balance of the keymat 30*g*.

FIGS. 19–24 show snap dome constructions and trace arrangements are particularly useful in the IACK matrix of FIG. 4, as they enable reliable, temporary and simultaneous electrical contact between multiple (in this case, four) underlying traces when the dome or other tactile feedback structure is tripped or snapped. These constructions advantageously accommodate misalignment between snap domes or pills, and underlying traces, for more reliable system operation. Trace extensions 50 electrically terminate under the tactile elements 40.

Figure 18:
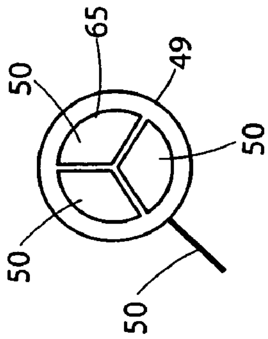
FIG. 18 shows a metal dome construction for making four simultaneous electrical contacts.

FIG. 18 shows a round metal dome 49 that snaps to connect four trace extensions 50, such as in a combination key region of an IACK keypad. The metal dome itself is permanently attached to one trace 50*a*, with the three other traces 50 connected to respective conductive wedges underneath the dome through vias 65 from another layer of the PCB. When the metal dome 48 is snapped downward toward the PCB surface, the center of the dome electrically connects the conductive wedge surfaces of each trace 50, thereby indicating to the system the user's intent to activate a combination key.

Figure 19:
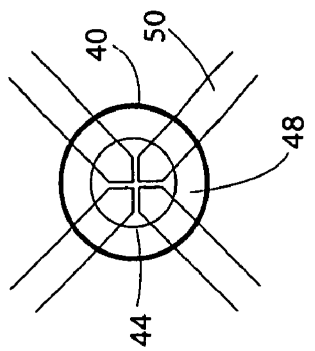
FIG. 19 shows a polyester dome construction for making four simultaneous electrical contacts.

In FIG. 19 a non-conductive tactile element 40, such as a polyester dome 48, connects the distal ends of four underlying traces 50 through conductive ink 44 disposed on the underside of the dome. Ink 44 may be applied across the entire extent of the central region of the dome, as shown, or in a raised ring at the perimeter of area 44, such that electrical contact is confined to a narrow annular region.

Figure 20:
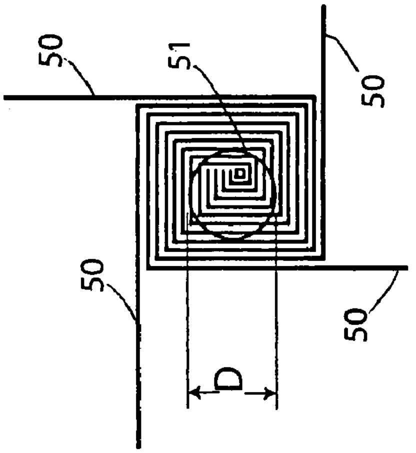
FIG. 20 shows a trace pattern for a matrix junction that accommodates contact element placement inaccuracies.

FIG. 20 shows, in outline, a carbon pill 51 superimposed on four traces 50 patterned into a spiral in an IACK combination key region. Notably, the diameter "D" of the electrical contact area provided by carbon pill 51 is substantially greater than, here more than two times, the radial contact distance required to connect all four traces 50 at any location within the pattern. This allows for inaccuracies in the relative positions of the carbon pill 51 and the pattern of traces 50. When the carbon pill 51 is pressed, it electrically connects all four additional traces 50, even if offset from the center of the pattern, as shown, such as due to manufacturing variability or use variation introduced by the user. Circular spirals and other tightly wound patterns are also envisioned.

Figure 21:
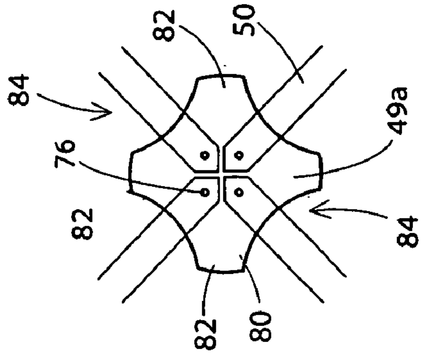
FIGS. 21–23 illustrate other metal dome constructions for making four simultaneous electrical contacts.
Figure 22:
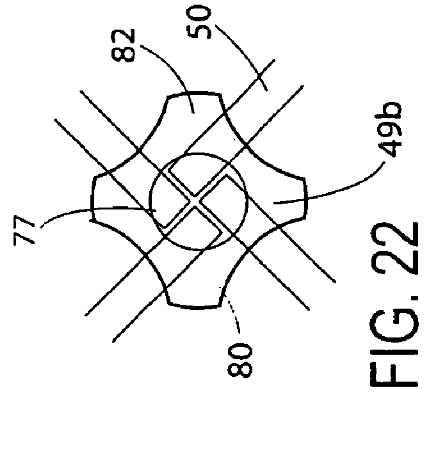
Figure 23:
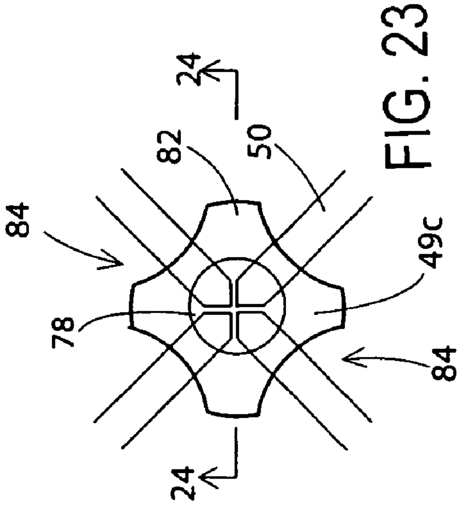
Figure 24:
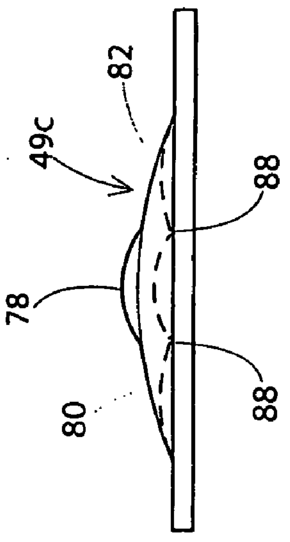
FIG. 24 is a cross-sectional view, taken along line 24—24 of FIG. 23.

FIGS. 21–23 each show a cross-shaped metal dome configured to connect four traces 50. In each illustration, the edge of the dome is secured to the PCB only at the ends 80 of the arms 82 of the cross-shaped dome, leaving arched openings 84 through which the trace extensions 50 pass without contacting the metal dome in the normal state. When the dome is snapped downward, the dome forms a bridging contact between the trace extensions. In FIG. 21, for example, dome 49*a* has a plurality of dimples 76 depending from its concave side, at least one dimple arranged to engage each trace 50 when the dome is snapped downward. In FIG. 22, dome 49*b* includes a contoured central area 77 configured such that, when dome 49*b* is snapped downward to contact the underlying PCB, area 77 is substantially planar and parallel to the PCB, rather than dished to have a convex lower surface when actuated, as is the case with typical domes. In another case, area 77 is instead textured to provide more reliable contact over a larger surface area. In FIG. 23, dome 49*c* has a central area 78 of different curvature than the surrounding area of the dome, as shown in FIG. 24. As the dome is pressed downward, the region of the peripheral portion just outside of central area 78 snaps or inverts at a force lower than that required to invert central area 78. As the peripheral area snaps, the perimeter of area 78 of the dome engages the underlying traces in an annular region 88 of a diameter approximately that of area 78 that crosses all four traces, as shown in dashed outline in FIG. 24.

Figure 25:
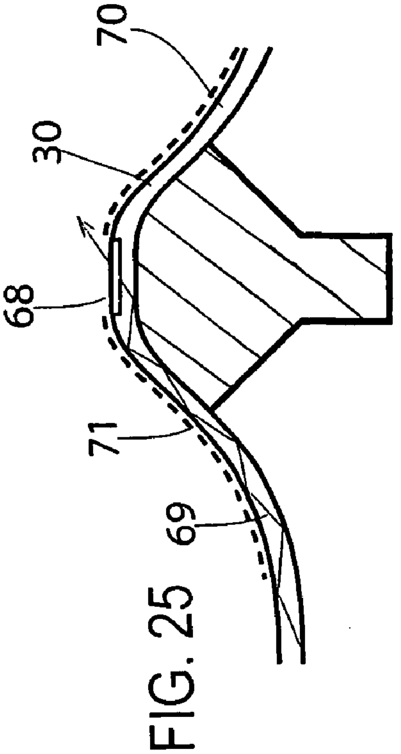
FIG. 25 illustrates light being transmitted along a keymat sheet to a key region graphic.
Figure 26:
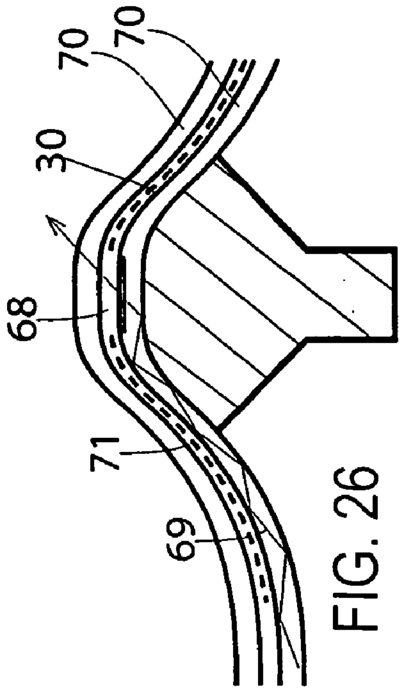
FIG. 26 illustrates light transmission in a keymat laminate.

In FIG. 25, lighting is provided to keymat 30 by transmitting light 69 through the sheet 70, which is being used as a light pipe, allowing light 69 to flow to a maximal number of graphic characters while also acting as a diffuser there between, minimizing "hot spots," relatively intense concentrations of light. As shown here, the material of sheet 70 is predominantly transparent, with an ink 71 disposed on the outer surface providing color to keymat 30. The ink 71 is selectively omitted from the surface, creating voids 68 in the shape of characters or other symbols through which light is emitted, thereby defining the characters in part with light. If voids 68 are created by an etching process, such as by laser, the depth of the etch may extend into the material of sheet 70, thereby creating a character-shaped depression in the keymat 30 to better illuminate the graphics. In this manner, the embodiments provide the graphics with "side" lighting in addition to the more traditional "back" lighting. Employing translucent ink 71 allows the surface of the product to glow. A clear, hard coating may be sprayed over ink 71 for durability. FIG. 26 shows two sheets 70 laminated together, in which the outer sheet protects the ink 71 from scratching, and the inner sheet 70 provides a transmission path for light 69.

Figure 27:
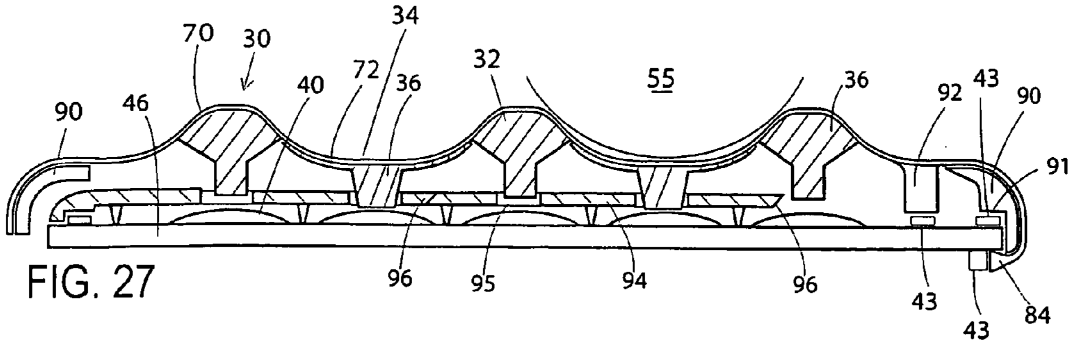
FIGS. 27–31 are cross-sectional views through various keypads, illustrating different keypad constructions and lighting means.

FIG. 27 shows a keymat 30 with a variety of embodiments to introduce light 69 into sheet 70. In one embodiment, housing 90 is made of a transparent rigid material suitable for light piping (such as polycarbonate) and includes inlet feature 91 predominantly orthogonal to the light emitted from LED 43 such that visible light is collected 69 into sheet 70. Another embodiment includes guide 92, permanently attached to sheet 70 and disposed to extend between an optically transmissive, thin plastic sheet 70 and a light source 43, such as an LED. Guide 92 may be integrally molded with force concentrators 36. The figure also shows a light funnel 84 disposed on at least one edge of sheet 70. Funnel 84 gradually narrows (as a function of the index of refraction of the material to provide a high degree of internal reflection) such that a maximal amount of light 69 from a source like LED 43 can enter. Funnel 84 can be integrally extruded into sheet 70 as it is manufactured. Sheet 70 may subsequently be stamped to remove portions of the funnel other than adjacent LEDs.

The "side-lighting" of these embodiments also provides a glow to housing 90, an effect that is believed to enhance the market appeal of devices incorporating this feature. FIG. 27 also shows pipe 94 used to supply backlight to the center of an IACK keypad, which, in addition to providing backlight, may also serve as a source of side-lighting by transmitting light into sheet 70. Pipe 94 is perforated with holes 95 through which force concentrators 36 pass and which includes reflectors 96 to divert light upwards to the underside of keymat 30. LED 43 is mounted on at least one periphery of the switch matrix and injects light 69 into pipe 94 with a reflector 96. Individual, elastomeric, flexible light pipes (not shown) may connect LEDs 43 to central areas of keymat 30.

Figure 28:
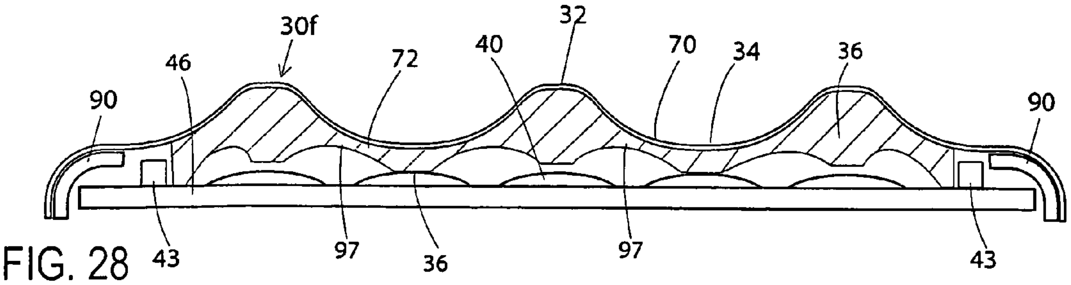

FIG. 28 shows keymat 30*f* with force concentrators 36 formed from an optically transmissive elastomeric material, such as clear silicone, in which a plurality of concentrators 36 are connected by an integrally molded, thin web 97. The respective heights of each force concentrator 36 are similar to other disclosed embodiments, except for variations necessary to accommodate the selected durometer and the material compression that will occur above each tactile element 40, as a function of the tactile force each provides.

Figure 29:
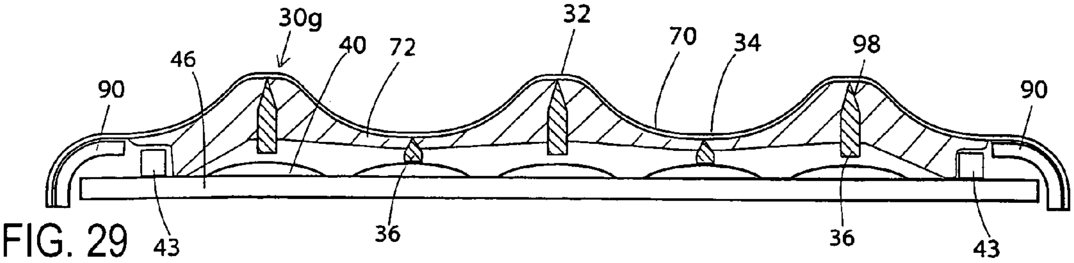

FIG. 29 shows keymat 30*g*, a variation of the embodiment of FIG. 28, in which force concentrators 36 are formed of a rigid, optically transmissive material, and are cone-shaped for improved light transmission and material compression. These may be formed with a two shot in-mold process, in which the elastomeric material forming web 97 is formed first and a second shot forms a higher durometer material of the force concentrators 36. Alternatively, concentrators 36 may be insert-molded in a softer elastomer. The upper surfaces of concentrators 36 may be shaped to form letters or other symbols identifying key regions.

Figure 30:
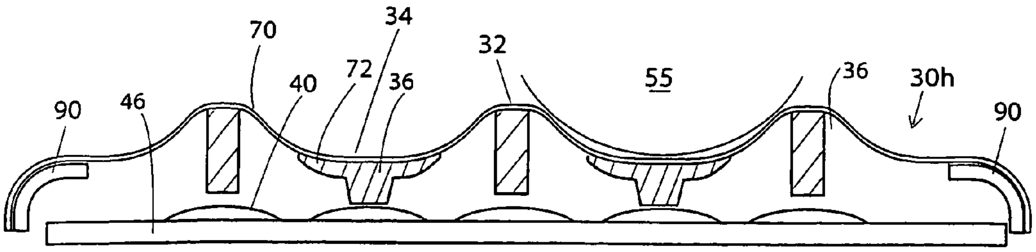

FIG. 30 shows a keymat 30*h*, a variation of the embodiments shown in FIGS. 11–16, in which the high differential between the combination keys 34 and independent keys 32 is minimized, so as to maximize the contact of finger 55 with the base of combination key 34, to increase force transmission directly between the finger 55 and the associated force concentrator 36.

Figure 31:
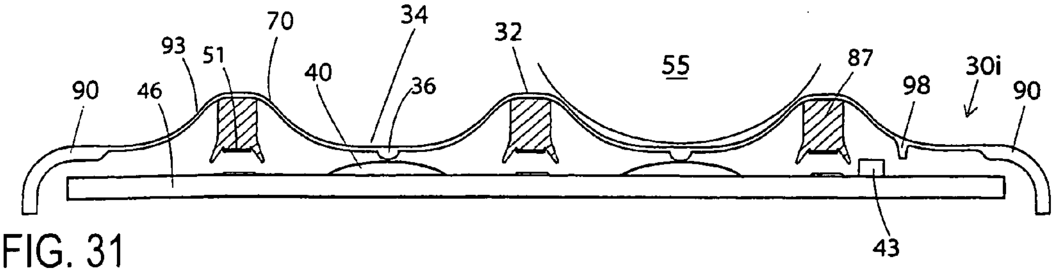

FIG. 31 shows keymat 30*i* in which sheet 70 is made of engineering grade plastic, such as polycarbonate, and integrally molded with the housing 90. This reduces assembly cost and part count while also providing hard plastic IACK keymat with a seamless barrier to contaminants. Force concentrators 36 are also integrally molded below the combination key regions 34. The combination key regions have a relatively high tactile feedback from metal or poly dome tactile feedback elements 40. However, molded tactile feedback elements 87 below the independent key regions 32 provide a relatively low tactile feedback, as their associated circumferential flanges 89 collapse at the bottom of an activation stroke. This provides distinctly different feedback between the combination keys and independent keys, such that the combination and independent key regions each mimic the familiar tactile response of different devices, such as a phone and a desktop keyboard (respectively) in this example. Carbon pills 51 are disposed at the base of molded tactile feedback elements 87 where they activate the associated switch as they contact PCB 46. The tactile feedback provided by flanges 89 may be provided by other means, such as deformation of sheet 70. That is to say that sheet 70, such as the sloped portion 93 around the plateau centers of each independent key region 32, may be molded to provide tactile feedback. Travel limiters 98 may also be integrally molded within sheet 70 to protect LEDs 43.

A number of embodiments of the invention have been described. Nevertheless, it will be understood that various modifications may be made without departing from the spirit and scope of the invention. For example, one skilled in the art may alter the orientations of the vertical, horizontal, drive, receive, independent and combination keys of any of the matrices shown herein. Accordingly, other embodiments are within the scope of the following claims.

What is claimed is:

1. A keypad comprising a keymat and a switch substrate underlying the keymat, wherein the keymat comprises a continuous sheet with an exposed upper surface forming separate elevated independent key regions that each, when pressed independent of adjacent keys, produce an associated output, the sheet defining combination key regions between adjacent independent key regions that, when such adjacent independent key regions are pressed in combination, produce an output associated with the combination key region;

the substrate comprising independent tactile feedback structures underlying respective independent key regions of the keymat, and combination key tactile feedback structures underlying respective combination key regions of the keymat.

2. The keypad of claim 1 wherein both independent and combination key regions display graphics associated with their outputs.

3. The keypad of claim 1 wherein the independent key regions have greater associated stroke length than the combination key regions.

4. The keypad of claim 1 wherein the combination key regions have a lower associated actuation force than the independent key regions.

5. The keypad of claim 1 wherein the sheet is made of a plastic material with elastic modulus of at least 100,000 pounds per square inch.

6. The keypad of claim 1 wherein effective stroke lengths of both the independent and combination key tactile feedback structures are essentially the same.

7. The keypad of claim 1 wherein the keymat sheet forms an undulating surface contour of exposed key regions.

8. The keypad of claim 1 wherein the independent key regions are arranged in rows and columns.

9. The keypad of claim 1 wherein the keymat sheet has an exposed surface hardness of at least 1 foot-pound per inch, measured as an Izod impact strength, notched.

10. The keypad of claim 1 wherein the keymat sheet comprises a material selected from the group consisting of polyester and polycarbonate resins.

11. The keypad of claim 1 further comprising a light source introducing light into an optically transmissive layer of the keymat, thereby illuminating graphics associated with multiple key regions of the keymat with light conducted along the keymat layer from the light source.

12. The keypad of claim 1 configured such that the combination key tactile feedback structures are actuated by pressing two diagonally-oriented independent key regions adjacent a corresponding combination key region.

13. The keypad of claim 12 configured such that pressing two diagonally-oriented independent key regions adjacent the combination key region actuates the combination key tactile feedback structure underlying the combination key region before actuating either of the tactile feedback structures underlying the two pressed independent key regions.

14. The keypad of claim 1 wherein the independent and combination key tactile feedback structures comprise snap domes.

15. The keypad of claim 14 wherein the snap domes are formed of metal.

16. The keypad of claim 14 wherein the snap domes are formed of polyester.

17. The keypad of claim 1 wherein the keymat sheet consists essentially of thermoformed resin and graphics.

18. The keypad of claim 17 wherein the graphics are pre-applied prior to thermoforming.

19. The keypad of claim 17 wherein the graphics are defined by resin of the sheet.

20. The keypad of claim 1 wherein the substrate comprises a trace matrix underlying the keymat, the matrix including normally isolated column traces and row traces, each column trace underlying independent key regions of a corresponding column of key regions, and each row trace underlying independent key regions of a corresponding row of key regions, the row and column traces together defining an array of normally open trace intersections corresponding to the independent key regions; and trace extensions extending from the row and column traces to underlie the combination key regions, the trace extensions in each combination key region extending to within a contact region of an associated electrical contact beneath the combination key region.

21. The keypad of claim 20 wherein the trace extensions extend to distal ends disposed beneath the combination key region.

22. The keypad of claim 20 comprising at least three trace extensions disposed within each combination key region.

23. The keypad of claim 22 comprising four trace extensions disposed within each combination key region.

24. The keypad according to claim 1, further comprising a light source positioned to introduce light into an optically transmissive layer of the keymat and thereby illuminate graphics associated with multiple key regions of the keymat with light conducted along the keymat layer from the light source.

25. The keypad of claim 24 wherein the optically transmissive layer is of an optically transmissive polymer in continuous contact with the sheet having the exposed upper surface.

26. The keypad of claim 24 further including a light pipe disposed between the keymat and the light source and configured to direct light from the light source toward a light inlet on the keymat.

27. The keypad of claim 24 wherein the optically transmissive layer comprises an elastomeric web containing a series of rigid inserts disposed directly above corresponding tactile feedback elements associated with independent key regions of the keymat.

28. The keypad according to claim 1, wherein the independent key regions are arranged in an array of multiple rows and columns, and wherein the combination key regions are defined between rows and columns of the array of independent key regions; the keypad further comprising a trace matrix underlying the keymat, the matrix including normally isolated independent key column traces and row traces, each independent key column trace underlying the independent key regions of a corresponding column, and each independent key row trace underlying the independent key regions of a corresponding row, the independent key row and column traces together defining an array of normally open trace intersections corresponding to the array of independent key regions; and a processor responsive to electrical communication between independent key row and column traces at any trace intersection closed by independent key region actuation; wherein the trace matrix also includes combination key column traces and row traces interposed between independent key column and row traces and underlying the combination key regions, with each combination key column trace electrically joined to an associated independent key column trace, and each combination key row trace electrically joined to an associated independent key row trace.

29. The keypad of claim 28 wherein each combination key column trace is electrically joined to an associated independent key column trace separated from the combination key column trace by at least two other independent key column traces.

30. The keypad of claim 28 wherein each combination key row trace is electrically joined to an associated independent key row trace separated from the combination key row trace by at least two other independent key row trace.

31. The keypad of claim 28 wherein the trace matrix is connected to the processor only by a number of conductors equal to the sum of the number of rows and the number of columns of the array of independent key regions.

32. The keypad of claim 28 wherein the trace matrix is connected to the processor by only (M+N) data lines and wherein the keypad defines $(M\times N)+(M-1)\times(N-1)$ independently actuatable key regions, where M and N are of the group consisting of all positive integers.

33. The keypad according to claim 1, further comprising a series of independent key force concentrators disposed beneath an underside of the sheet under respective independent key regions; and a series of combination key force concentrators secured to and extending from an underside of the sheet under respective combination key regions;

wherein the independent key tactile feedback structures underlie respective independent key force concentrators of the keymat; and wherein the combination key tactile feedback structures underlie respective combination key force concentrators of the keymat.

34. The keypad of claim 33 wherein, with the keypad at rest, the independent key force concentrators are separated from their underlying independent key tactile feedback structures by a distance greater than any separation distance between the combination key force concentrators and their underlying combination key tactile feedback structures.

35. The keypad of claim 33 wherein the force concentrators associated with the independent key regions engage the underside of the sheet only directly beneath upper plateau areas of the independent key regions.

36. The keypad of claim 33 wherein, with the keypad at rest, the independent key force concentrators are separated from their associated tactile feedback structures by a distance greater than an effective stroke length of the tactile feedback structures.

37. The keypad of claim 33 wherein the keymat further comprises ribs depending from the keymat sheet and extending between respective combination key force concentrators and independent key force concentrators.

38. The keypad of claim 37 wherein the ribs are tapered.

39. The keypad of claim 33 wherein the keymat sheet and force concentrators are formed of differing materials.

40. The keypad of claim 33 wherein the independent and combination key force concentrators are molded in place on the keymat sheet.

41. The keypad according to claim 1, wherein the independent key regions are arranged in an array of multiple rows and columns, and wherein the combination key regions are defined between rows and columns of the array of independent key regions;

the keypad further comprising:

a trace matrix underlying the keymat, the matrix including normally isolated column traces and row traces, each column trace underlying the independent key regions of a corresponding column, and each row trace underlying the independent key regions of a corresponding row, the row and column traces together defining an array of normally open trace intersections corresponding to the array of independent key regions; and a processor responsive to electrical communication between row and column traces at any trace intersection closed by independent key region actuation; wherein the trace matrix includes trace extensions extending from the row and column traces to underlie the combination key regions, the trace extensions in each combination key region extending to within a contact region of an associated electrical contact beneath the combination key region.

42. The keypad of claim 41 wherein trace extensions extending from the row traces form a first part of an auxiliary matrix, and trace extensions extending from the column traces form a second part of the auxiliary matrix and define auxiliary intersections with the trace extensions extending from the row traces, the auxiliary intersections being in electrical communication with corresponding intersections of the trace matrix.

43. The keypad of claim 42 wherein the processor is configured to distinguish between an auxiliary intersection and its corresponding intersection of the trace matrix by a determined order in which individual intersections are closed.

44. The keypad of claim 41 wherein the opposed electrical contact is displaced into contact with the trace extensions by simultaneous actuation of independent key regions on opposite sides of the combination key region.

45. The keypad of claim 41 wherein the trace matrix is connected to the processor only by a number of conductors equal to the sum of the number of rows and the number of columns of the array of independent key regions.

46. keypad of claim 41 wherein each combination key region is bounded by two column traces and two row traces.

47. The keypad of claim 46 wherein the trace matrix includes four trace extensions underlying each combination key region.

48. The keypad of claim 41 wherein the trace extensions of each combination key region have distal ends extending toward a common point within the combination key region.

49. The keypad of claim 41 wherein the trace extensions form a spiral pattern within the combination key region.

50. The keypad of claim 41 wherein the opposed electrical contact comprises a snap dome under the combination key region.

51. The keypad of claim 50 wherein the snap dome consists essentially of an electrically conductive material.

52. The keypad of claim 51 wherein the snap dome has an edge defining openings through which the trace extensions extend without contacting the dome edge.

53. The keypad of claim 50 wherein the snap dome has dimples extending downward from an underside surface of the dome and arranged to engage the trace extensions when the dome is snapped downward.

54. The keypad of claim 53 wherein one dimple is arranged to engage one trace extension, and another dimple is arranged to engage another trace extension, when the dome is snapped downward.

55. The keypad of claim 54 wherein the snap dome has four dimples arranged to engage four respective trace extensions when the dome is snapped downward.

56. The keypad of claim 50 wherein one of the trace extensions of the combination key region is in permanent electrical communication with the snap dome, other trace extensions of the combination key region extending to conductive pads under the dome.

57. The keypad of claim 50 wherein the snap dome straddles distal ends of the trace extensions.

58. The keypad of claim 50 wherein the snap dome carries a layer of electrically conductive material on an underside of the dome facing the trace extensions.

59. The keypad of claim 58 wherein the layer of electrically conductive material covers only a central region of the snap dome.

60. The keypad of claim 58 wherein the snap dome consists essentially of an electrically insulating material formed into a dome shape, and the layer of electrically conductive matenal.

61. The keypad of claim 60 wherein the electrically insulating material is a polyester resin.

62. A keypad comprising a keymat and a switch substrate underlying the keymat, the keymat comprising a continuous sheet defining both an active region in which an exposed upper surface forms separate elevated independent key regions that, when pressed independent of adjacent key regions, produces an associated output, the sheet defining combination key regions between adjacent independent key regions that, when pressed in combination, produce an output associated with the combination key region; and a deflection zone about a perimeter of the active region, the keymat having a lower stiffness in the deflection zone than in the active region.

* * * * *